United States Patent [19]

Hoffman

[11] Patent Number: 4,525,264

[45] Date of Patent: Jun. 25, 1985

[54] CYLINDRICAL POST MAGNETRON SPUTTERING SYSTEM

[75] Inventor: David W. Hoffman, Ann Arbor, Mich.

[73] Assignee: Ford Motor Company, Dearborn, Mich.

[21] Appl. No.: 327,971

[22] Filed: Dec. 7, 1981

[51] Int. Cl.³ .............................................. C23C 15/00
[52] U.S. Cl. .................................. 204/298; 204/192 R
[58] Field of Search ............................ 204/192 R, 298

[56] References Cited

U.S. PATENT DOCUMENTS

| 3,884,793 | 5/1975 | Penfold et al. | 204/298 |
| 3,995,187 | 11/1976 | Penfold et al. | 313/346 |
| 4,030,996 | 6/1977 | Penfold et al. | 204/192 |
| 4,031,424 | 6/1977 | Penfold et al. | 313/146 |
| 4,041,353 | 8/1977 | Penfold et al. | 315/267 |
| 4,126,530 | 11/1978 | Thornton | 204/192 |
| 4,179,351 | 12/1979 | Hawton, Jr. et al. | 204/298 |
| 4,180,450 | 12/1979 | Morrison, Jr. | 204/298 |
| 4,221,652 | 9/1980 | Kuriyama | 204/298 |
| 4,356,073 | 10/1982 | McKelvey | 204/192 R |
| 4,374,722 | 2/1983 | Zega | 204/298 |

FOREIGN PATENT DOCUMENTS 53-58489  5/1978  Japan ..................................... 204/298

OTHER PUBLICATIONS

J. L. Vossen et al., *Thin Film Processes,* Academic Press, New York, 1978, pp. 76–79, 134–136.

*Primary Examiner*—G. L. Kaplan
*Assistant Examiner*—William T. Leader
*Attorney, Agent, or Firm*—Paul K. Godwin, Jr.; Robert D. Sanborn

[57] ABSTRACT

In a tubular bodied cathode of a sputtering magnetron, at least one permanent magnet is mounted so as to produce magnetic field flux lines that lie in planes oriented transverse to the axis of the cathode body, along a predetermined length thereof. Through appropriate biasing, in a partial pressure ionizable gas atmosphere, a plasma is generated that resembles a closed loop tunnel extending along said predetermined length on the outer surface of the cylindrical cathode, as defined by the magnetic field. Relative rotation between the cathode and the magnetic field provides for even erosion of sputtering material from the surface of the cathode.

4 Claims, 15 Drawing Figures

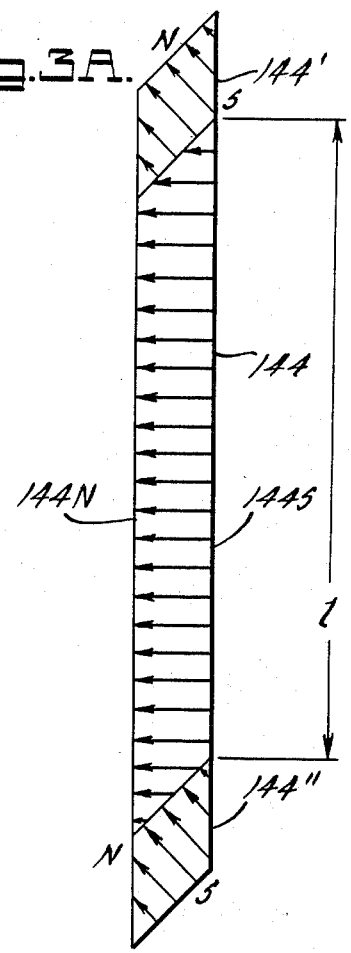
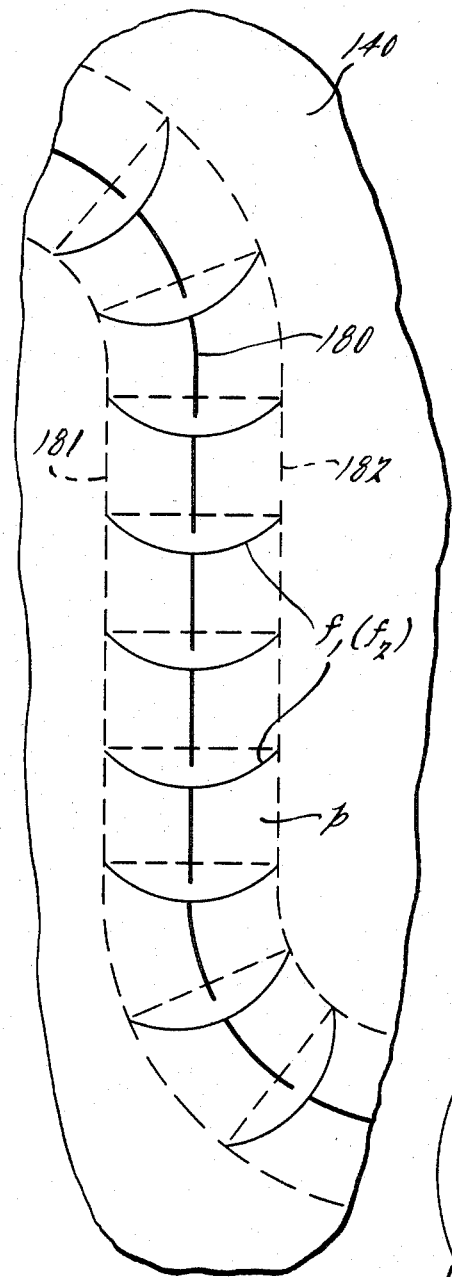
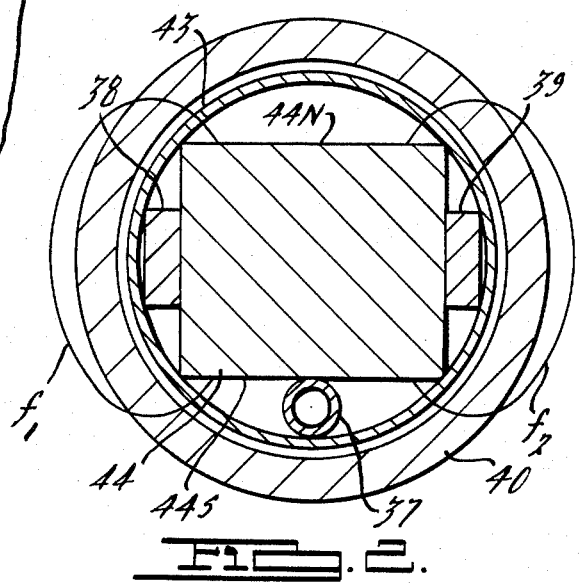

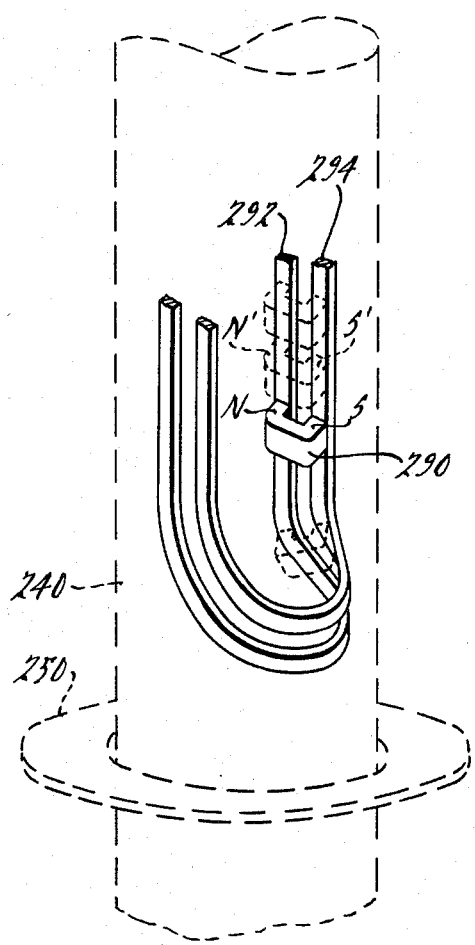
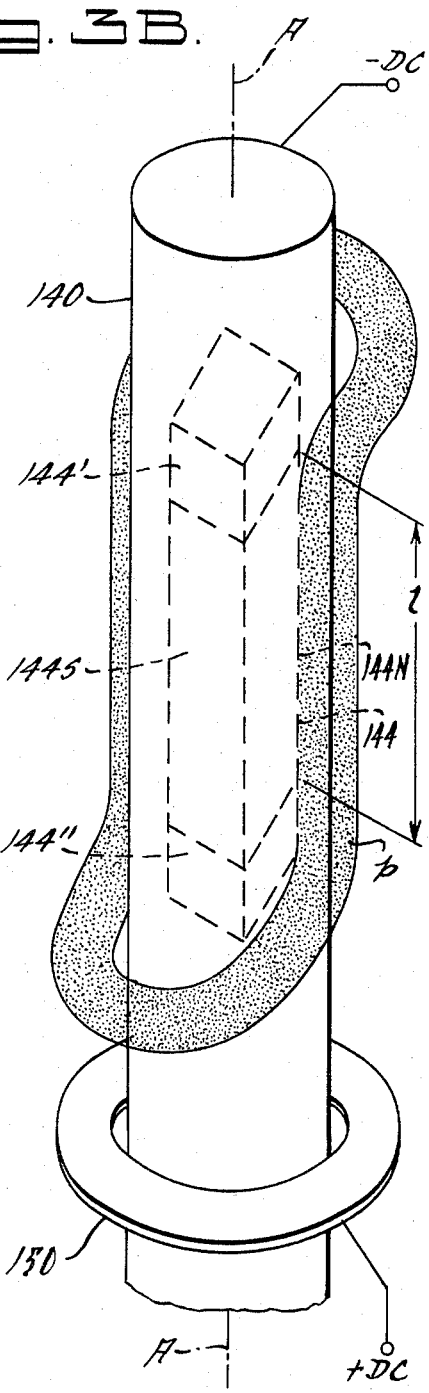

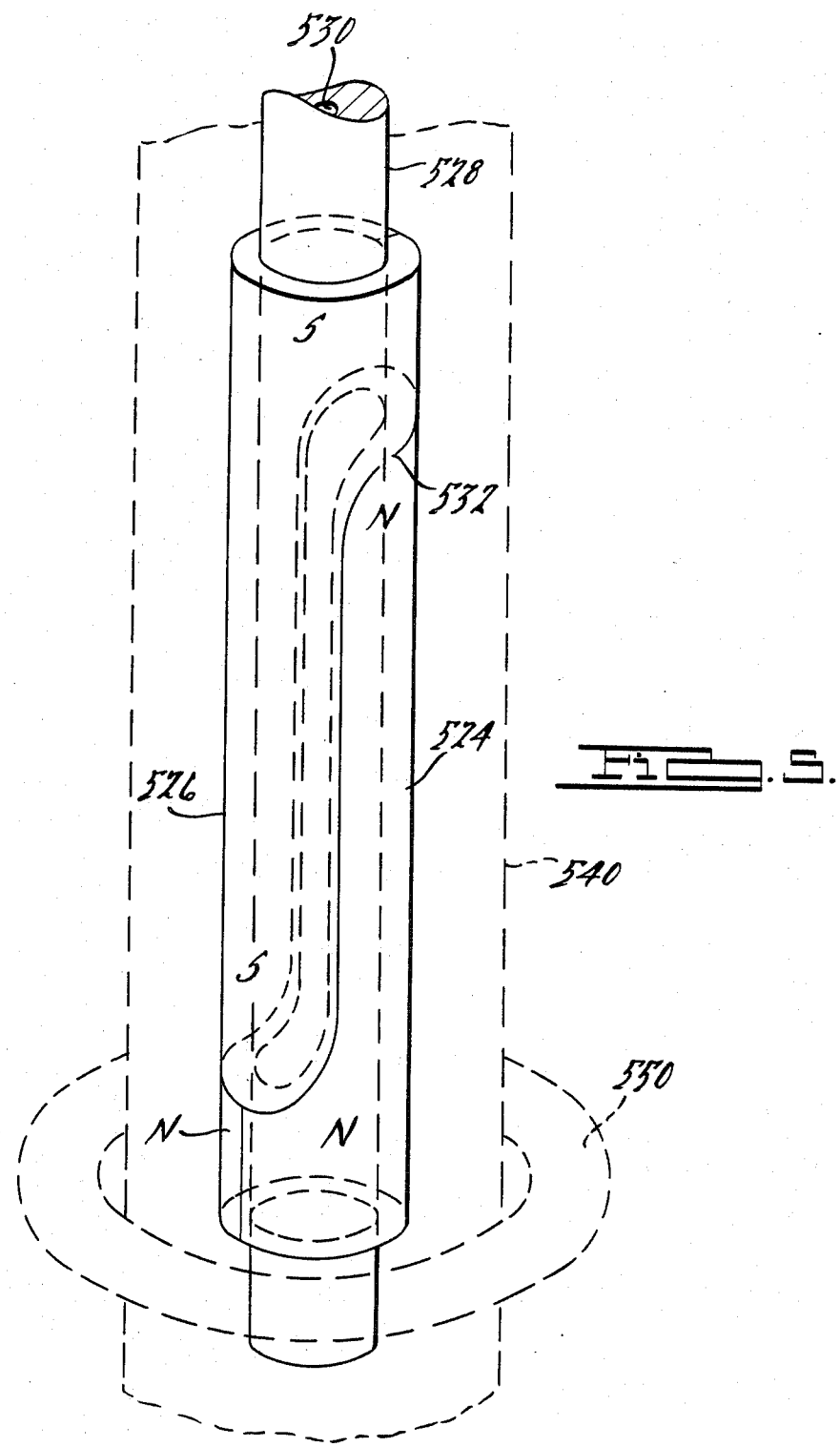

CYLINDRICAL POST MAGNETRON SPUTTERING SYSTEM

BACKGROUND OF THE INVENTION

1. Field of the Invention:

The present invention is directed to the field of vacuum sputtering deposition and more specifically to improvements in the area of cylindrical post magnetron systems.

2. Description of the Prior Art:

It is well known that when an electrical discharge is created between two electrodes at low gas pressure, the cathode electrode (often referred to as the target) is eroded due to the bombardment of ionized gas molecules thereon. The bombardment of gas molecules onto the cathode material strips atoms therefrom and those atoms are transported to condense on surrounding surfaces. The target cathode can be of any material or combination of materials including metals, alloys and semiconductors. Due to the high energy levels involved, the liberated atoms of cathode material are caused to travel in the ionized gas and arrive at a surface at such speeds as to give some degree of adhesion.

More intense bombardment rates of gas molecules at the cathode have been achieved through the use of specially designed magnetic fields that confine the electrons and consequently the ionized gas in closed loop paths at the surface of the cathode.

Magnetic confinement of electrons has also been instrumental in reducing the amount of substrate heating caused by the impingement of the energetic electrons onto the substrate surfaces.

U.S. Pat. Nos. 3,884,793; 3,995,187; 4,030,996; 4,031,424; 4,041,353; and 4,126,530 are commonly directed to cylindrical post magnetron systems which utilize an externally generated magnetic field having defined field flux lines that run parallel to the length dimension and surface of the cylindrical target-cathode. The systems described in the aforementioned patents produce efficient sputtering of the cathode-target material from a cylindrical post magnetron over a 360° range. However, the systems are cumbersome, in that the external solenoid coils used to generate the external magnetic fields are relatively massive with respect to the cathode-target cylinder. Furthermore, due to the parallel magnetic field requirement, the system vacuum enclosure must be either constructed of a non-magnetic material or it must be sufficiently large enough to enclose the field generating coils and place the coils detrimentally within the vacuum chamber.

U.S. Pat. Nos. 4,179,351 and 4,221,652 are directed to cylindrical magnetron sputtering sources, each utilizing a tubular cylindrical target-cathode and at least one cylindrical magnet coaxially mounted within the tubular cathode. Each internally mounted cylindrical magnet is oriented symmetrically about the axis of the target-cathode cylinder so as to generate a toroidal magnetic field tunnel defined by flux lines that lie in planes parallel to the axis of the target-cathode cylinder. The '351 patent describes its technique as an improvement over an external magnet generated field type of magnetron, in that it provides a sputtering apparatus suitable for the efficient deposition of material upon the interior surface of a substantially cylindrical workpiece. It further describes an advantage wherein the electrons and charged ions are effectively confined to a volume proximate to the cathode surface, by the use of small permanent magnets.

It is noted that the toroidal fields generated in the devices described in the '351 and '652 patents may cause uneven and inefficient removal of the cathode surface material forming circular grooves in the cathode, that may be overcome by producing relative oscillatory movement between the cathode surface and the magnetic field along the axis of the cathode.

SUMMARY OF THE INVENTION

The present invention provides a cylindrical sputtering cathode having internal magnet field generating means of novel orientation and design so as to effect, with suitable voltage and low-pressure gas environment, a magnetron sputtering discharge that can be swept over the external surface of the cathode by simply rotating the internal magnet means on the cylindrical axis. A novel feature of the present invention is a sputtering discharge path that meanders over the length of the external surface of the cylindrical cathode. The magnetron sputtering discharge is guided by an electron confinement tunnel of arch-like magnetic field lines projected as loops, from an internally mounted magnet means, through the cathode surface. Therefore, the magnet means of the present invention are designed to project a magnetic tunnel that meanders in a correspondingly prescribed manner over the length of the cathode, while maintaining the salient magnetron characteristic that the path of the tunnel return on itself to form a closed loop. Thus, rotation of the internally mounted magnet means causes the magnetic electron confinement tunnel and associated sputtering discharge to be circumferentially swept over the external surface of the cathode, thereby resulting in uniform sputter erosion of the target and uniform emission of coating material.

Accordingly, it is an object of the present invention to provide an improved cylindrical sputtering source having upon its external surface an internally-generated, tunnel-shaped magnetic field the closed path of which meanders in a prescribed manner along the length of the tubular cathode.

Another object of the invention is to provide a cylindrical sputtering source from which efficient and uniform erosion of the target material can be accomplished by the relatively simple expedient of continuously rotating the internal magnetic field generating means or conversely by rotating the tubular cathode body.

A further object of the invention is to provide a cylindrical sputtering source which utilizes the rotation of internally mounted magnets to achieve uniform deposition, both circumferential and lengthwise, of sputtered material onto surrounding workpieces.

A still further object of the invention is to provide a cylindrical sputtering source that achieves the preceeding objectives while at the same time incorporating improved compactness of design and convenience of deployment owing to the elimination of the necessity of either reciprocating motion mechanisms or bulky external coils.

A still further object of the invention is to provide a cylindrical sputtering source from which circumferentially directional emission of sputtered material can be effected and utilized to selectively coat portions of a workpiece, or workpieces passing to one side of the source, and to advantageously control the microstructure and properties of the deposited coating material itself.

Further objects and advantages of this invention will become apparent from a consideration of the drawings and ensuing description thereof.

BRIEF DESCRIPTION OF THE DRAWINGS

FIG. 2 is a cross-sectional view of a portion of the invention taken along line II—II in FIG. 1.

FIG. 3A is a conceptual illustration of the permanent magnet utilized in the embodiment of the invention shown in FIG. 1.

FIG. 3B is a conceptual illustration of the plasma loop formed on the embodiment of the invention shown in FIG. 1.

FIG. 3C is a conceptual illustration of the arched magnetic field flux lines which form the close loop tunnel employed in the present invention.

FIG. 4 is an internal view of alternative permanent magnet arrangements for the present invention.

FIG. 5 illustrates another embodiment of the invention employing flexible magnetic material.

DETAILED DESCRIPTION OF THE PREFERRED EMBODIMENTS

The post-type cylindrical sputtering cathode of this invention consists essentially of a tubular body projecting into or through a vacuum chamber within which a sputter coating process is to be carried out. The outer surface of the tube consists of some chosen material that is to be sputtered off in the course of the coating process. This so-called target material may be the structural material of the cathode body itself or an outer layer applied to the cathode expressly for the purpose of becoming the target. Requirements of the tubular cathode body are that it be vacuum tight, electrically conductive, and non-magnetic, although exceptions to the latter two conditions can be handled by special techniques (RF power for non-conductive materials; saturating magnetic fields for magnetic materials).

The interior of the tubular cathode contains cooling water and magnetic field generating means, from which at least one tunnel-shaped magnetic field is projected out through the shell of the tubular cathode into the surrounding space of the vacuum chamber. The magnetic tunnel is continuous and defines a closed path upon the external surface of the sputtering cathode, the course of which is dictated by the shape and placement of the poles on the magnetic means within. The essence of the present invention is that the magnetic means and the resultant magnetic tunnel make one or more longitudinal excursions along the length of the cathode such that, if the magnet is rotated on the cylindrical cathode axis, the magnetic tunnel sweeps across a lengthwise portion of the target. Within this basic concept there are many possible magnet shapes and modes of construction that can be employed to practice the invention. A number of these are detailed herein to indicate the great variety.

Figure 1:
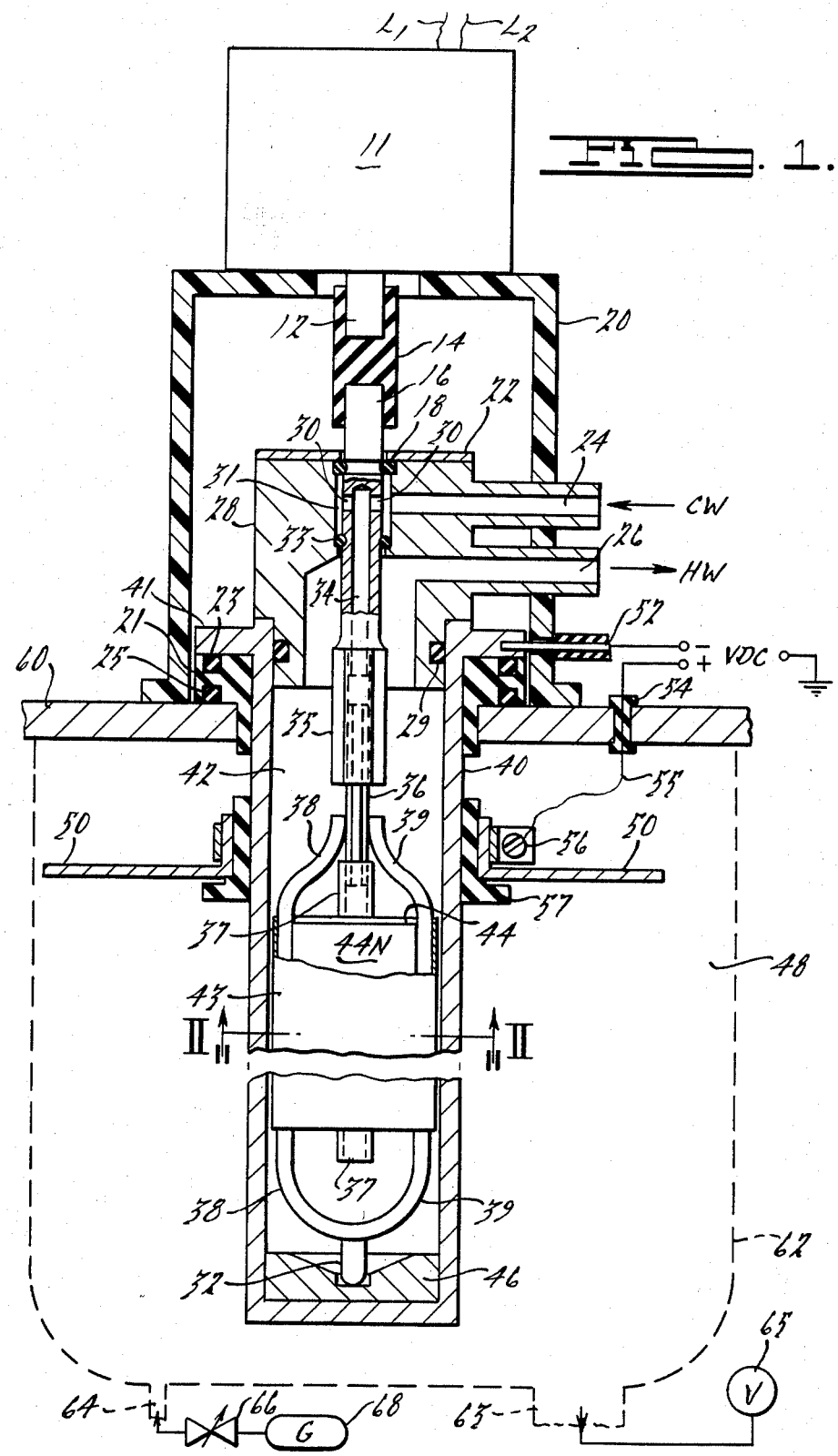
FIG. 1 is a cross-sectional view of a preferred embodiment of the present invention.

While the cylindrical post magnetron sputtering system, of the present invention, is physically embodied in apparatus shown in FIGS. 1 and 2, the principles involved in making the present invention unique to this art, are more clearly shown in FIGS. 3A, 3B and 3C. Accordingly, this description is initially directed to FIGS. 3A, 3B and 3C.

A tubular cathode body 140 is formed as a closed surface of a material which is to be sputtered therefrom. The cathode 140 is formed about a central axis A and is positioned adjacent a typical anode structure 150. In FIG. 3B, the anode 150 is shown as an annular electrode which surrounds the cathode 140 and is electrically insulated therefrom. Other anode configurations, such as elongated rods, surrounding screens or chamber walls may also be used.

A permanent magnet 144 is positioned inside the tubular cathode 140 and has the property of elongated pole surfaces 144N and 144S oppositely disposed over a predetermined length "l". The field lines generated by magnet 144 lie in planes which are transverse to the axis A and together form a magnetic tunnel, which is conceptualized in FIG. 3C.

The surface of the cathode 140 is shown with a plurality of field lines $f_1$ extending therefrom, due to the placement of the magnet 144 within the cathode 140. Over the longitudinal length "l" of the magnet 144, the field lines form a magnetic tunnel roughly defined by edge lines 181 and 182 alongside a meandering longitudinal tunnel path 180. Of course, the magnetic tunnel is important to a functioning sputtering device in that an electron trap is formed in this magnetic field to promote bombardment and erosion of material from the cathode surface. The magnet 144 is provided with oblique end pieces 144' and 144" that distort the magnetic field at the ends and provide a continuous (non-bifurcated) closed loop formation of the magnetic tunnel running along path 180.

When a biasing voltage potential of approximately −300 to −1200 volts DC is applied to the cathode 140 and the cathode is placed in a partial pressure atmosphere of an ionizable gas, such as argon, electrons are emitted by the cathode and trapped within the prescribed meandering path 180 of the closed loop magnetic tunnel. A plasma p is generated along the length l due to the ionization of the gas in the electron trap formed by the closed loop magnetic tunnel of the magnetic field.

The unique configuration of the poles of the magnet 144 within the cathode body 140 provides for even erosion of material along the length of the cathode surface. Relative rotation between the two provides for even erosion of the material over the entire surface of the cathode.

The invention, as conceptually depicted in FIGS. 3A–3C, is embodied in an apparatus shown in FIGS. 1 and 2. In that apparatus, a tubular cathode 40 is formed as a cylinder of electrically conductive material having an outer surface coated with the material to be sputtered onto a workpiece (not shown). The cathode 40 is mounted so as to project into a vacuum chamber 62 through an aperture in a vacuum chamber cover plate 60. The cathode 40 is electrically insulated from the normally grounded cover plate 60 by an insulating collar 21 which supports the upper flange 41 of the cathode 40. Vacuum and water seals are provided by respective upper and lower O-rings 23 and 25 on the insulating collar 21.

A water-tight cap 28 is provided at the top of the cathode 40 above the flange 41 so as to seal the inner chamber 42 of the cathode 40 and provide both inlet and outlet passages 24 and 26 for water cooling the cathode 40.

An O-ring seal 29 is provided between the water-tight cap 28 and the upper end of the cathode 40. The water-tight cap 28 is provided with a central aperture 31 and an upper aperture sealing plate 22 for retaining a partially hollow rotational driving shaft 16. The shaft 16 is sealed in the aperture 31 via upper and lower O-rings 18 and 33 respectively. The upper end of the shaft 16 is interconnected with a motor drive shaft 12 extending from a motor 11 via a flexible insulating shaft coupling 14. The shaft 16 is provided with transverse water inlet holes 30 which provide communication between the hollow aperture 31 and an axial passage 34 that extends from the transverse inlet holes 30 to the lower end of the shaft 16. The lower end of the shaft 16 is designated as a hexagonal socket 35 which is used to transfer rotational driving forces coupled to the upper end of the shaft 16 to an inserted hollow hexagonal shaft 36. The upper end of the hexagonal shaft 36 is fitted into the hexagonal socket 35 and is rigidly connected to a yoke having upwardly extending arms 38 and 39.

The lower end of the yoke having upwardly extending arms 38 and 39, contains a pivot nib 32 which rests in a centering bearing pad 46 formed in the lowermost sealed end of the cathode chamber 42. A tube 37 is connected to the lower end of the hollow hexagonal shaft 36 and extends to the lower end of the cathode chamber 42.

The arms 38 and 39 of the yoke retain the magnet 44 in a relatively fixed location and provide the transfer of rotational driving forces to the magnet 44. A containing sleeve 43 is placed over the magnet and yoke assembly so as to rotate therewith when driving forces are applied from the motor 11.

When cooling water is applied through cold water inlet 24, the water flows into the passage 31, transverse passages 30, axial passage 34, the hollow center of shaft 36 and through tubing 37 to enter into the lower end of the cathode chamber 42. The cooling water is then forced upward over the magnet 44, along the inner walls of the cathode chamber 42 to cool the cathode material and up towards the outlet 26.

An anode 50 is shown as disposed adjacent to the cathode 40 so as to provide the necessary electric field. An elongated rod-like anode (not shown) is an alternative embodiment of anode 50 which also provides the electric field. In the embodiment shown in FIG. 1, an insulating collar 57 is provided so as to be frictionally attached to the outer surface of the cathode 40. An annular anode 50 is clamped around the insulating collar 57 and tightened with a screw adjustment 56. An electrical connection is made between the screw adjustment 56 and the positive terminal of a DC power supply (not shown) via a line 55 which extends through an insulated feed-through 54 in the vacuum chamber cover plate 60. A negative potential is applied to the cathode 40, from the same power supply, via electrical terminal 52.

An insulative housing 20 rests on the vacuum chamber cover plate 60 to provide support for the motor 11 and contains apertures to receive the drive shaft 12 of the motor 11, the inlet 24, the outlet 26 and electrical terminal 52.

The vacuum chamber 62 contains a purging outlet 63 connected to a vacuum pump 65. The chamber 62 also contains an inlet 64 which allows the ionizable gas from a storage tank 68 to enter through a regulating valve 66 to provide the ionizable gas at a partial pressure.

As can be seen in the cross-section shown in FIG. 2, the field lines $f_1$ and $f_2$ form an electron tunnel that extends over a length 1 on diametrically opposite sides of the cathode 40.

FIG. 4 illustrates an alternative embodiment to the high intensity magnetic field generating means illustrated in FIGS. 1-3. In the FIG. 4 embodiment, several U-shaped magnets 290 are clamped along a meandering pair of magnetic pole pieces 292 and 294 mounted internal to a tubular cathode 240. The pole pieces 292 and 294 are in the form of tracks which define the meandering path of the electron trap magnetic tunnel on the outer surface of the cathode 240.

The embodiment shown in FIG. 4 allows for a cathode sputtering device to be designed to fit a particular need such as may be encountered in an installation where the cathode is considerably larger than the magnets required to form the field. In such an embodiment, it may be more efficient to rotate the cathode and rigidly mount the magnets, etc.

A magnetic tunnel configuration similar to the one previously described in FIG. 4 utilizing rigid magnets can be achieved with flexible magnet material by a method of construction detailed in FIG. 5. A mandrel 528, preferably of ferromagnetic material, with a coolant passage 530 is wrapped with strips or sheets of flexible magnet material in two portions. A first sheet 524, with its north pole exposed and a second sheet 526 with its south pole exposed are each trimmed, bent, or otherwise contoured so that the joint 532 between the adjacent oppositely exposed poles traces out the desired course of the magnetic tunnel. Thus for the tunnel configuration under discussion, the joint is contoured to the shape of the lei-like loop of FIG. 3B. Flexible magnetic materials, such as those used for sheets 524 and 526, consist of particles of ferromagnetic alloy or compound embedded in a polymeric matrix, and are typically available in flat strips, tapes, or sheets. Such material can be easily cut or trimmed to shape and laid up in multiple layer to achieve a desired strength of field. The magnetic particle material used in flexible magnets is commonly barium ferrite, but higher energy-product materials, such as cobalt-samarium, facilitates the achievement of the magnetic field strengths required for magnetron sputtering.

Figure 6:
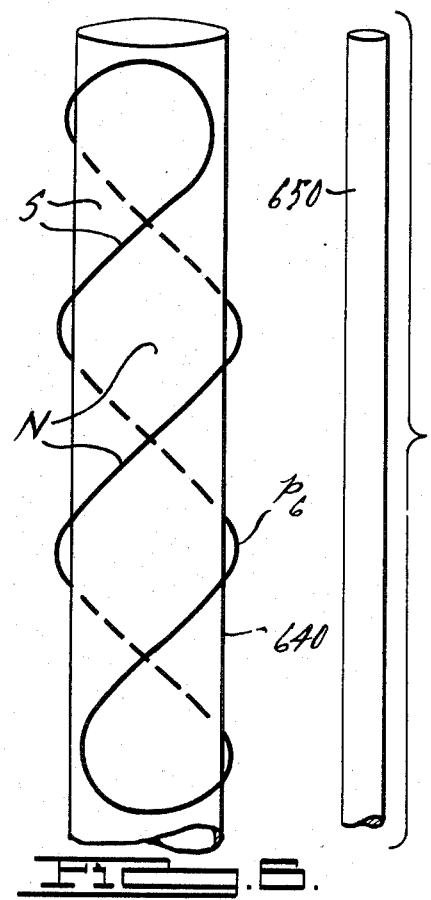
FIGS. 6–13 are exemplary of alternative embodiments of the present invention, illustrating various cylindrical post cathode configurations and meandering closed loop tunnel paths.

The FIG. 5 embodiment leads readily to a further embodiment of the invention as shown in FIG. 6 and having great potential utility. The principal distinguishing feature of this further FIG. 6 embodiment is a spiral wrapping of the longitudinal extended north and south magnetic poles about the cylindrical axis of the cathode 540. FIG. 6 shows the resultant spiral path $p_6$ of the magnetic electron confinement tunnel over the surface of a cylindrical cathode 640. Clearly this magnet structure is more easily constructed using the flexible magnetic material than rigid magnet segments, which is not to say that a rigid magnet of the requisite geometry could not be specially fabricated for this purpose. A geometric variable that can be readily altered and controlled in this spiral geometry is the angle or pitch of the twist. Likewise the pole configurations of the ends of the magnet can be rounded and/or gapped to minimize nonuniform grooving at the ends of the sputter-eroded portion of the cylindrical cathode during sputter deposition. An anode configuration that is particularly well adapted to use with the spiral magnet means is a rod or bar parallel to the cylindrical cathode. Such an anode 650 is indicated in FIG. 6. The anode 650 is always adjacent to some portion of the spiral plasma loop as the magnet rotates inside the cathode, and therefore smoothly and continually sweeps off the low-energy electrons from the extremities of the confined magnetron discharge.

It is apparent that a magnetic tunnel is erected wherever strips of magnetic material are positioned edge to edge with opposite polarity, as indicated in FIG. 5. In this manner, an unlimited variety of tunnel configurations can be constructed. This method of magnet construction has been detailed to indicate that the fabrication of a wide variety of magnetic configurations is indeed feasible. However, any other specific magnet fabrication scheme including electromagnetic actuation that projects a magnetic tunnel with axial or longitudinal extension is also forseen.

A number of such magnetic tunnel configurations with various distinguishing features are illustrated in FIGS. 7 to 12. In these figures, distinct configurational features are occasionally grouped for economy of illustration without intending to imply that they would necessarily be combined that way in practice. For simplicity, the path of a magnetic tunnel over the exterior of a cylindrical cathode is indicated in these figures by a single heavy line, which is also the net EXB drift trajectory followed by entrapped energetic electrons when magnetron sputtering is carried out. It is understood, unless otherwise indicated, that in each illustration the magnetic tunnel can be scanned around the circumference of the sputtering cathode by rotation of the internal magnets.

Figure 7:
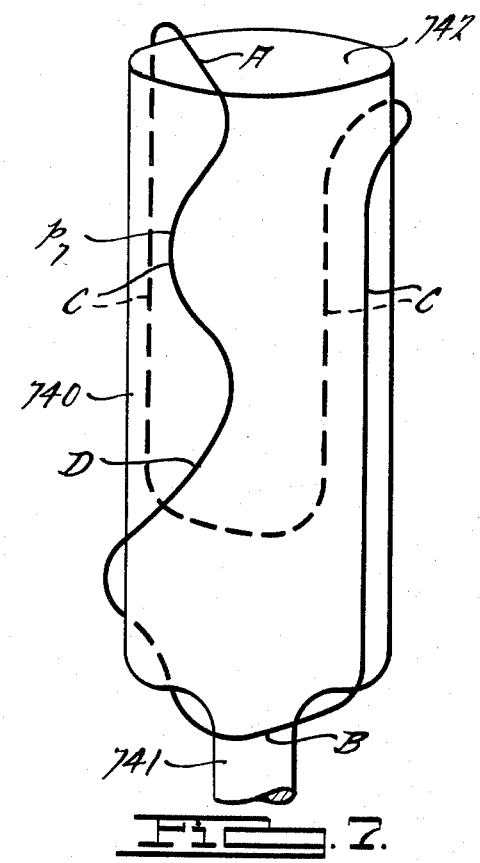

FIG. 7 includes a combination of several variants to indicate that the magnetic tunnel may (A) pass over the closed end of the cathode, (B) pass across a reduced stem or shank thereof, and (C) have more than two longitudinal segments, which may have varying lengths or (D) contorted shapes. It illustrates a cylindrical cathode 740 with a connecting end 741 and a closed end surface 742. The meandering tunnel path is shown as $p_7$ and is configured to extend over the end surface 742 to cause erosion of material from all the surfaces as relative rotation between the path $p_7$ and the cathode 740 occurs.

Figure 8:
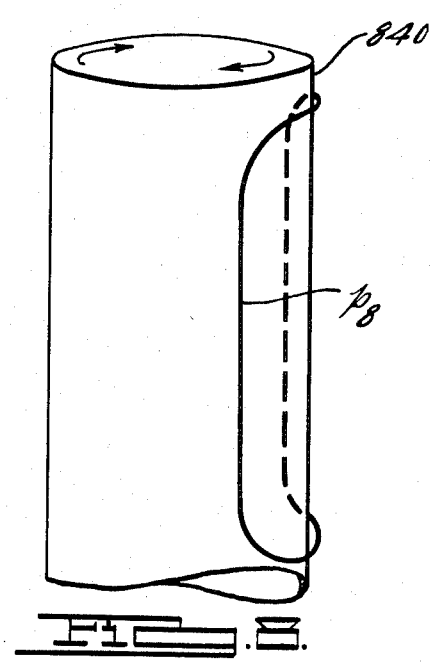

FIG. 8 illustrates a cylindrical cathode 840 having a closed end configuration and a meandering tunnel path $p_8$ which is concentrated on one side of the cathode. FIG. 8 shows the case of a magnetic tunnel path $p_8$ that does not circumscribe the cylindrical cathode, but where, instead, the "end loops" traverse the same side of the cathode in forming the closed electron trap.

FIG. 8 also illustrates an important variant of a different nature, namely that scanning of a magnetic tunnel over the cathode surface to effect uniform erosion can be achieved by rotating the tubular cathode shell 840, while the internal magnet is held stationary. This mode of operation can be utilized to obtain directional emission of coating flux, e.g., concentrated to one side of the sputtering cathode, while maintaining efficient utilization of the target material. It is expected that one may provide for simultaneous rotation of both the magnet and the tubular cathode shell, if desired, in either the same or opposite direction.

Figure 9:
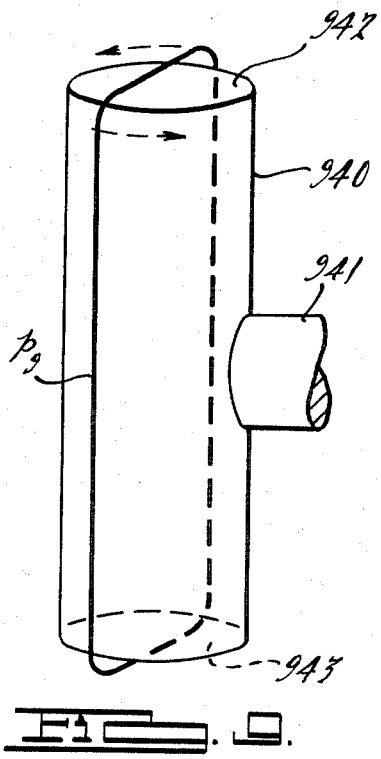

FIG. 9 illustrates a cylindrical cathode 940 having opposite enclosed ends 942 and 943 and a connecting shaft 941. A symmetrically meandering path $p_9$ tunnel extends diammetrically over the entire length of the cathode 940 and the two ends 942 and 943. FIG. 9 illustrates a variant of the magnetic tunnel in which the closed electron trap path $p_9$ configuration is achieved by passing over the two closed ends 942 and 943 of the cylindrical sputtering cathode 940 that is supported from the side by the shaft 941 through which pass cooling water and a means for rotation. In operation, the plasma loop in the magnetic tunnel path $p_9$ may extinguish or diminish temporarily as it passes by the supporting arm. The magnet means in this case can be especially simple, since no canted end pieces are required.

Figure 10:
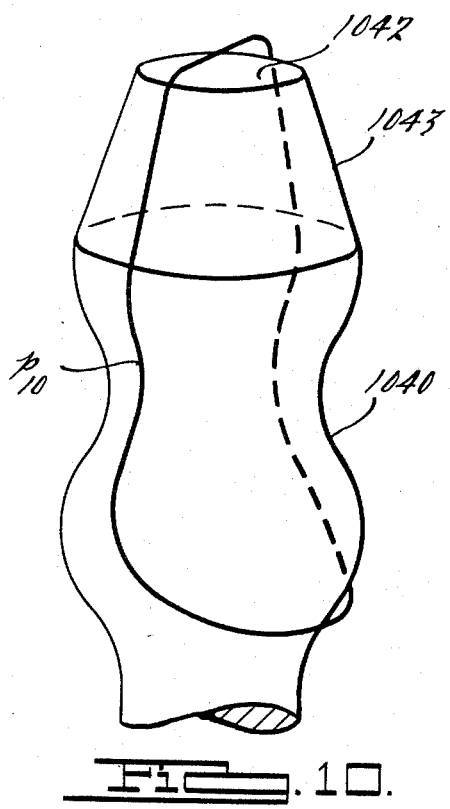

FIG. 10 illustrates a cylindrical type cathode having a varying cross-section along its length and the concept of a symmetrically formed cathode to meet a particular sputtering requirement with respect to shape and materials. In this instance, the cathode includes a truncated portion 1043 and a main body portion 1040 of separate sputtering materials and the meandering tunnel path $p_{10}$, extending for rotation, over both portions. The magnetic tunnel path $p_{10}$ can follow the contours of the cylindrical cathode 1040 with a varying or nonuniform cross-section, such as might be desirable for coating a contoured part or cavity. As before, rotation of the internal magnet scans the magnetic tunnel around the cathode, thereby distributing the sputter erosion over its external surface.

Figure 11:
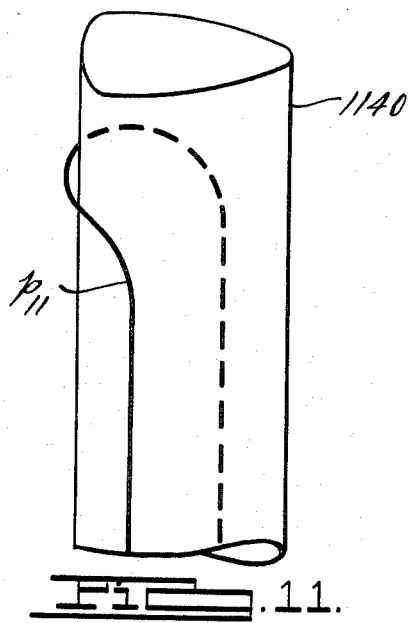

FIG. 11 shows one end of a cylindrical sputtering cathode 1140 with a non-circular cross-section. A magnetic tunnel path $p_{11}$ with axial extension can be projected upon this shape as well as any other. Cylindrical scanning of the tunnel by rotation of the internal magnet leads to some variation of field strength and sputtering intensity in this case, as the poles of the rotating magnet pass nearer to and further from the external walls of the cathode 1140.

Figure 12:
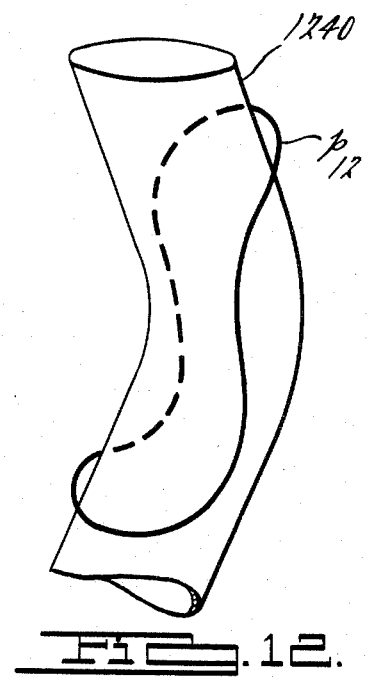

FIG. 12 illustrates a further variation in a uniquely configured cylindrical type cathode in that the cathode body 1240 is formed along a curved axis and the meandering tunnel path $p_{12}$ is configured so as to provide extended erosion of the surface material due to relative rotation therebetween. FIG. 12 shows the magnetic tunnel path $p_{12}$ deployed upon tubular cathode 1240 having a curved axis, with extension of the tunnel along the axis. Rotation, in this case, may require a hinged or flexible magnet body, but the principle remains the same.

Figure 13:
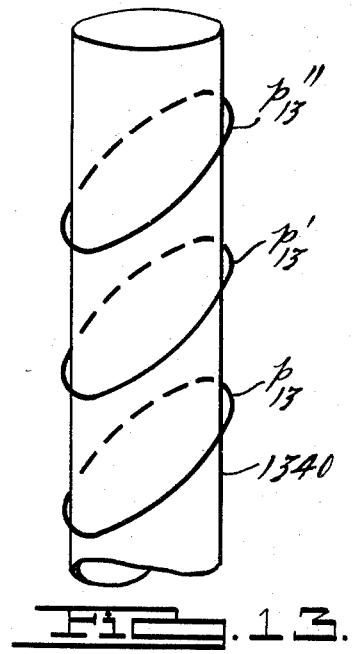

FIG. 13 illustrates a cylindrical cathode 1340 having a plurality of separate, but overlapping meandering tunnel paths $p_{13}$, $p'_{13}$, and $p''_{13}$.

Each of the embodiments of the present invention discussed above, meet the objectives of providing an improved cylindrical post magnetron sputtering source having an internally generated magnetic field that extends over a length of the cathode; and to provide a sputtering source in which the material is efficiently and evenly sputtered therefrom.

While it is apparent that many modifications and variations may be implemented without departing from the scope of the novel concept of this invention, it is intended by the appended claims to cover all such modifications and variations which fall within the true spirit and scope of the invention.

I claim:

1. A system for sputtering within a vacuum chamber containing a partial pressure of an ionizable gas including:

means providing a generally cylindrical closed surface cathode having a defined length dimension and the outer portion of said closed surface containing material to be sputtered therefrom:

means defining an anode adjacent said cathode;

means for generating a biasing voltage potential and providing connection of said potential between said cathode means and said anode means;

means mounted within said closed surface cathode means for generating a magnetic field oriented to define a closed loop electron confinement tunnel over the length of said cathode;

said magnetic field generating means including at least two flexible magnets each having oppositely disposed surfaces of opposite polarity adjacently wrapped around a support mandrel so that for each magnet one of said oppositely disposed surfaces faces the mandrel while the other surface is exposed and adjacent exposed surfaces are of opposite polarity, and the joint between the adjacent surfaces defines said closed loop electron confinement tunnel.

2. A system as in claim 1, further including means for producing relative rotational movement between said cathode and said magnetic field generating means.

3. A system as in claim 1, wherein said at least two flexible magnets are elongated strips adjacently disposed and spirally wound about said support mandrel.

4. A system as in claim 3, further including means for producing relative rotational movement between said cathode and said magnetic field generating means.

* * * * *